United States Patent [19]

Havens

[11] Patent Number: 4,949,053

[45] Date of Patent: Aug. 14, 1990

[54] OSCILLATOR HAVING FEEDBACK ISOLATED FROM ITS OUTPUT

[76] Inventor: Richard C. Havens, 613 Sabal Lake Dr., Apt. 211, Longwood, Fla. 32779

[21] Appl. No.: 401,917

[22] Filed: Sep. 1, 1989

[51] Int. Cl.$^5$ ............................................. H03B 5/00
[52] U.S. Cl. .............................. 331/96; 331/107 SL; 331/117 D; 331/117 FE
[58] Field of Search ............... 331/96, 107 SL, 108 R, 331/109, 117 R, 117 FE, 117 D

[56] References Cited

U.S. PATENT DOCUMENTS 4,775,845 10/1988 McCoy ................................. 331/96

OTHER PUBLICATIONS

Podcameni et al., "Design of Microwave Oscillators and Filters Using Transmission-Mode Dielectric Resonators Coupled to Microstrip Lines", IEEE Trans. on Microwave Theory and Tech, vol. MTT-33, pp. 1329–1332, Dec., 1985.

Niehenke, "GaAsikey to Defense Electronics", Microwave Journal, Sep. 1985, pp. 36–44.

Komizo et al., "A 6 6Hz Highly Stabilized GalAs FET Oscillator Using a Dielectric Resonator" IEEE Trans. On Microwave Theory and Tech., pp. 197–199.

Primary Examiner—Robert J. Pascal

[57] ABSTRACT

An oscillator including an active gain device and feedback between the output of the the device and its input for sustaining oscillations that incorporates a power splitter between the output of the device, the output of the oscillator and a feedback path for isolating the feedback path from the output of the oscillator for improving power and frequency pushing.

9 Claims, 2 Drawing Sheets

OSCILLATOR HAVING FEEDBACK ISOLATED FROM ITS OUTPUT

BACKGROUND OF THE INVENTION

The present invention relates to oscillators and, more particularly, circuitry and method for providing isolation between the oscillator output and the feedback path to the input of the gain producing device of the oscillator to improve the operating characteristics thereof.

In general, most, if not all, oscillators include a two port gain producing device having an input and an output which produces an output signal at the output of the oscillator and feedback between the output and the input of the device of proper phase and gain to induce and sustain oscillation. There are a myriad of structures and methods for providing a feedback path to couple a portion of the output signal from the gain producing device back to its input. However, in all known oscillators the feedback path is not inherently isolated from the output of the oscillator wherein the phase of the feedback signal becomes a function of the characteristics of the load coupled to the output of the oscillator. This lack of isolation is critical in that large changes in the frequency and output power of the oscillator can be caused by a change in the impedance of the oscillator load. In the extreme, oscillation may not be sustained and the device could be destroyed due to extreme load mismatching.

Hence, a need exists for an improved oscillator in which isolation is provided between the output of the oscillator and the feedback path to the input of the gain producing device thereof for improving the frequency and power pulling characteristics of the oscillator.

SUMMARY OF THE INVENTION

Accordingly, it is an object of the present invention to provide an improved oscillator.

It is another object of the invention to provide an oscillator having improved frequency and power pulling characteristics.

Still another object of the present invention is to provide an improved oscillator having isolation between the output of the oscillator and the feedback path coupled between the output and input of the gain producing device of the oscillator.

Yet another oject of the present invention is to provide a microwave oscillator having coupler circuitry for splitting the power between the output of the oscillator and a feedback path while providing isolation therebetween.

In accordance with the above and other objects there is provided an oscillator comprised of a two port or three-terminal active device having feedback between the output and input thereof of the correct phase and magnitude to sustain oscillations and coupler circuitry for splitting the power from the output of the active device between the output of the oscillator and the feedback path while isolating the output of the oscillator from the feedback path.

It is a feature of the invention that the coupler circuitry is suited to be realized in many known microstrip or other known transmission line configurations such as a coupled line directional coupler, a Lange coupler, a Wilkinson power splitter, a branch line coupler, and a rat race coupler to name a few. However, only couplers or power splitters that provide isolation between the two output ports of the power splitter may be used.

DETAILED DESCRIPTION OF THE PREFERRED EMBODIMENT

It is to be understood that although the following description of the oscillator of the preferred embodiments is made using microwave microstrip oscillators as examples, the novel concept of isolating the output of the oscillator from the feedback path is useful in any type of oscillator. For instance, waveguide oscillators as well as any other oscillator having a two-port or three terminal active device are readily able to use the present invention. It is well within the scope of this invention that the two port active device might be any type of amplifier such as an monolithic microwave integrated circuit amplifier or any active three terminal device such as a FET, bipolar transistor or heterojunction transistor. Additionally, it is well within the scope of the present invention for one skilled in the art to realize that the novel concepts described herein also apply to voltage tuned oscillators which use varactors or other tuning devices, YIG oscillators and cavity oscillators.

Figure 1:
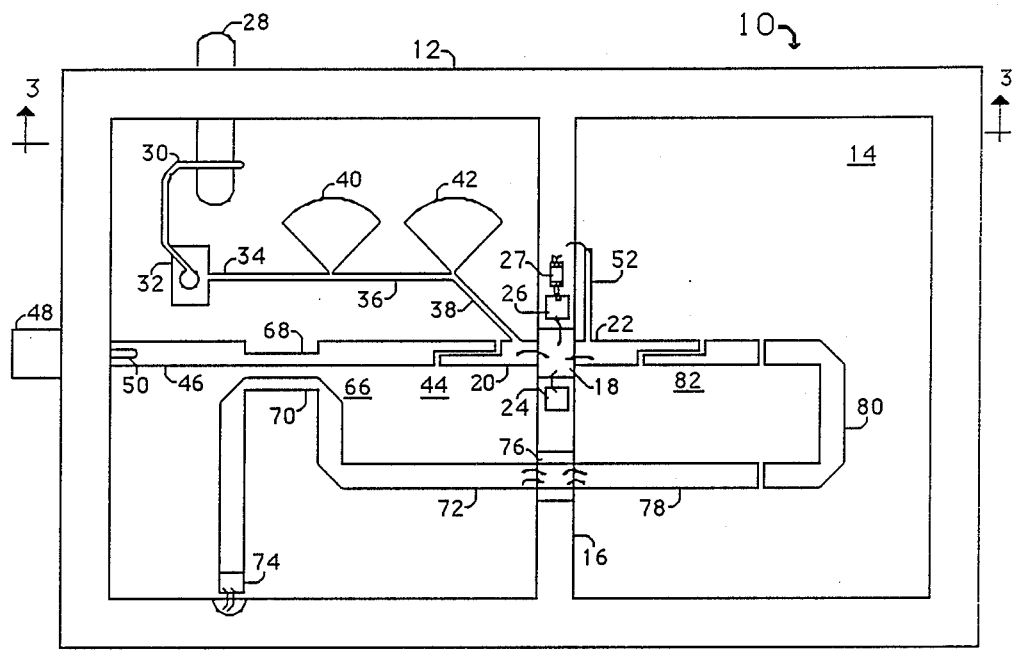
FIG. 1 is a top plan view illustrating an oscillator of the preferred embodiment with one means of providing isolated coupling between the output of the oscillator and the input of the gain device of the oscillator.
Figure 3:
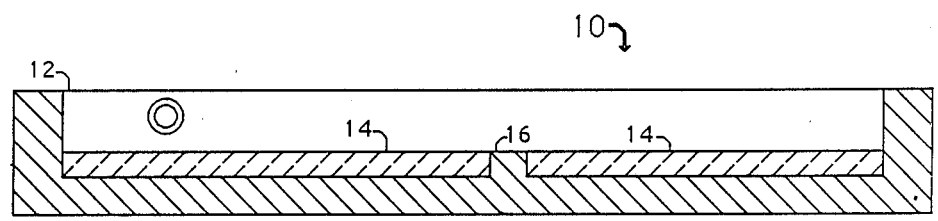
FIG. 3 is a cross sectional view of the oscillator of FIG. 1 taken in the direction of arrows 3—3.

Turning now to FIG. 1, there is shown the microstrip circuitry of a microwave oscillator 10. Oscillator 10 is enclosed within metal housing 12 and includes a substrate 14 (FIG. 3) upon which the microstrip circuitry is disposed as is known. Substrate 14 is divided by the metal rib 16 of housing 10. A three terminal active device 18, for example, a field effect transistor is disposed on rib 16 having its drain electrode coupled to conductor 20 by a bonding wire, its gate electrode coupled to conductor 22 by a bonding wire and its source electrode coupled through RF bypass capacitors 24 and 26 to RF ground potential via rib 16. A source of positive DC operating potential is supplied from feedthrough terminal 28 and lead 30 to conductive pad 32. The operating potential is coupled to the drain electrode of FET 18 through a conventional RF choke comprised of alternating quarter wavelength high impedance lines 34, 36 and 38 and quarter wavelength low impedance stubs 40 and 42. Hence, the DC potential is applied to the drain of FET 18 while at the operating frequency of the oscillator the RF choke presents a high impedance. The drain is coupled through DC block and matching transformer 44 to the output of the oscillator via center conductor 46. As understood in the art, power splitter 66, comprised of electro-magnetically coupled lines 68 and 70, should be properly power impedance matched for power flow from the output of the gain producing device 18 to both the oscillator output 48 and the feedback path from coupler 66 to the gate terminal of FET 18. A connector 48 provides external connection to oscillator 10 and is connected to conductor 46 via tab 50. The source electrode of FET 18 is RF bypassed to ground at the operating frequency via capacitors 24 and 26 while a DC conduction path is provided between the source and gate electrodes to establish the proper DC difference potential therebetwee via resistor 27 and RF choke or stub 52. Resistor 27 is coupled between the source electrode and ground. At the operating frequency, stub 52, being a quarter wavelength high impedance line, presents a high impedance to line 22 which electrically removes the DC bias circuit from the RF circuit.

Feedback is provided from the output of FET 18 to the gate electrode thereof as a portion of the output power is coupled through a conventional stripline power splitter section 66. Coupler 66 couples power from the output of transistor 18 to the two output ports of the power splitter to lines 46 and and 72 while isolating output 48 from the the feedback path to the gate electrode of transistor 18. Hence, any power traveling from connector 48 towards coupler 66 is coupled to load 74 and the continuation of line 46 and is isolated from the feedback path, line 72. Hence, power splitter section 66 comprises a quarter-wave section 68 of conductor 46 which electromagnetically couples power to section 70 of conductor 72. One end of the power splitter is terminated by a resistor to ground; resistor 74 being typically 50 ohms to match the conductor line impedance. Conductor 72 is connected to conductor 78 by substrate plug 76 the latter of which rests on rib 16 with connection being made by wire bonding as shown. A resonator 80 is electromagnetically coupled between conductor 78 and matching transformer 82. This resonator may or may not be present in the feedback path. When a resonator is used it may be of any type conceivable. A resonator is generally used to increase the Q of the oscillator and/or to electronically or machanically tune the frequency of the oscillator. Matching transofrmer 82 transforms the gate impedance of transistor 18 to properly load resonator 80 for correct insertion loss. Matching transformer 82 is not necessary if proper coupling is made between resonator 80 and line 22 to provide the correct insertion loss. Correct insertion loss is that value which will provide at least enough magnitude of signal to the gate electrode of transistor 18 to maintain oscillation and store energy in the resonator to raise the Q as is understood. Coupling between resonator 80 and line 78 should be adjusted for a power impedance match for the feedback signal. As is known to those skilled in the art, proper design of the oscillator requires the total phase shift from the gate terminal of FET 18 around the feedback path to the gate terminal to be zero degrees at the design frequency and the resonator to be resonant at or close to the design frequency. While no varactor is shown coupled to resonator 80 it is well understood and within the scope of the present invention for one skilled in the art to realize that the novel concepts described herein could include such a varactor coupled to resonator 80 to provide electronic tuning of the oscillator frequency.

In operation, transistor 18 provides gain at the desired operating frequency as well as a predetermined phase shift from input to output. By feeding back a portion of the output power provided at the drain electrode of transistor 18 to its gate electrode of the correct phase and magnitude, oscillation can be sustained at the desired oscillation frequency. Hence, except for the use of power splitter 66 for providing isolation between the output of the oscillator and the feedback path, oscillator 10 is generally understood by those skilled in the art.

A problem with oscillators of the type previously known is that the output power and frequency are directly affected by the load characteristics coupled to the output of the oscillator. As the load impedance is varied in phase and magnitude both the power and operating frequency of the oscillator varies. Power splitter 66 of the present invention minimizes the effect of the load impedance on power and frequency pulling of oscillator 10 by providing isolation between the oscillator load and the feedback path. By properly terminating power splitter 66 in matched impedances any reflected power from the oscillator load through terminal 48 will be isolated from line 72 and hence reduced in the feedback path. In the preferred embodiment power splitter 66 typically provides at least 20 dB of direct loss in the reverse direction, i.e., from output 48 to line 72 and hence the input of transistor 18 while splitting the power in the forward direction between the feedback path (line 72) and output terminal 48. Thus, power splitter 66 improves the performance of oscillator 10 by isolating the output of the oscillato from the feedback path thereof.

Figure 2:
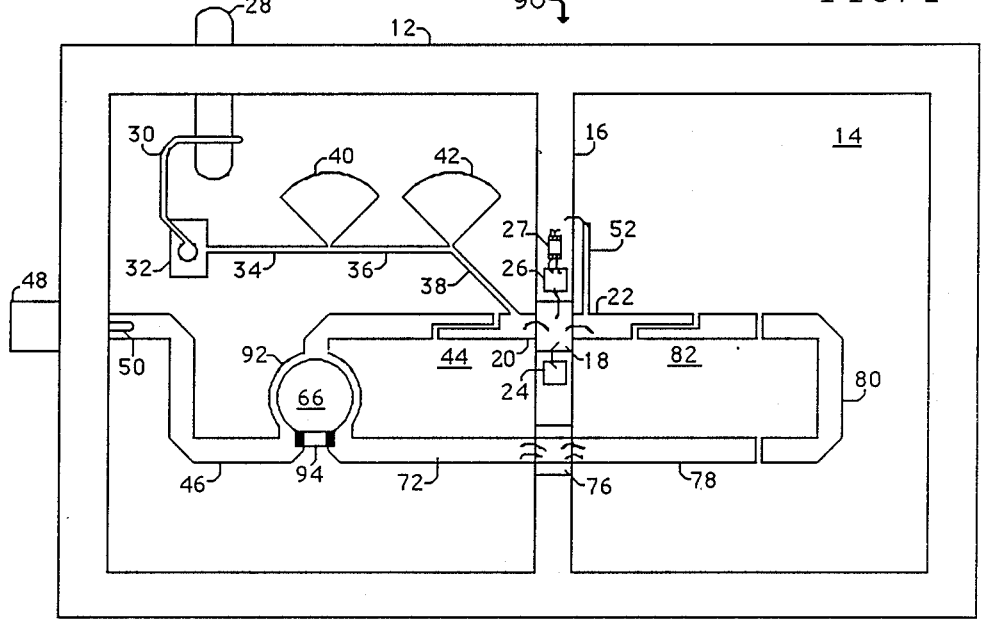
FIG. 2 is a top plan view illustrating another means of providing isolated coupling in the oscillator of the preferred embodiment.

Referring to FIG. 2 oscillator 90 is illsutrated which operates in the same manner as oscillator 10 described above and is shown with the components thereof corresponding to like components of FIG. 1 having the same reference numerals. Isolation between the output of oscillator 90 and the feedback path is provided by a Wilkinson type power splitter 92 and resistor 94.

Figure 4:
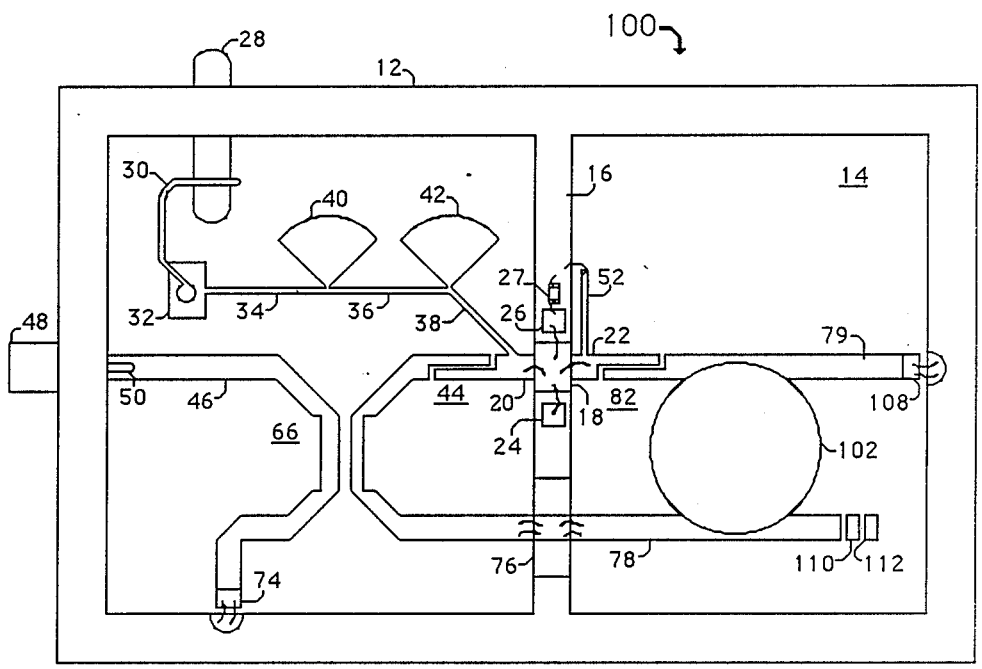
FIG. 4 is a top plan view illustrating a dielectric resonator stabilized oscillator according to the preferred embodiment.

Turning to FIG. 4 there is shown dielectric resonator stabilized oscillator (DRSO) 100 including power splitter 66 (FIG. 1) of the present invention. DRSO 100 is illustrated as another example of an oscillator suited to utilize the isolated feedback of the preferred embodiment. Again, components of FIG. 3 which correspond to similar components of FIG. 1 are designated by the same reference numerals. DRSO 100 comprises a dielectric resonator puck 102 coupled between conductor 78 of the feedback path and conductor 79. Typically, resonator 102 is placed above striplines 78 and 79 as described, for example, in U.S. Pat. No. 4,591,806, however, any suitable method may be employed as long as the correct coupling between the two lines is obtained. Resistor 108 may or may not be included for providing out of band stability. In all oscillators it is generally known that conditions for oscillation should not be present at any other frequency or frequencies than the desired frequency. This is called out of band stability. While not delineated herein, the oscillators representative of this invention must also be designed for out of band stability as is well known in the art. Tuning pads 110 and 112 may be used with wire bonds for changing the coupling of resonator 102 to stripline 78. If resistor 108 is not used, the same type of tuning pads may be used for changing the coupling of resonator 102 to stripline 79. Hence, what has been described above are several examples of oscillators wherein the improvement comprises using a power splitter for providing feedback between the output and input of the gain producing device thereof while isolating the oscillator output from the feedback path. By islotating the feedback path from the oscillator output the frequency and power pulling characteristics of the oscillator are improved.

What is claimed is:

1. A microwave oscillator including an active device for providing gain at the frequency of operation of the oscillator and a feedback path between the output of the device and the input of the device for providing a feedback signal to the latter of correct phase and magnitude for sustaining oscillations, wherein the improvement comprises a coupling circuit comprised of a power splitter including an input port and two output ports for splitting the power supplied from the device to said input port between both an output of the oscillator which is coupled to one of said two output ports and the feedback path which is coupled to the other of said two output ports while isloating said two output ports from each other to substantially inhibit any signals traveling from said output of the oscillator toward the device from being coupled into the feedback path.

2. The oscillator of claim 1 wherein the coupling circuit is a Wilkinson, coupled line or Lange coupler.

3. An oscillator for providing an oscillation signal at an output thereof, comprising:
   active device means for providing an amplified signal at an output thereof in response to receiving a signal at an input;
   means for supplying a feedback signal through a feedback path to said input of said active device of a predetermined phase and magnitude to produce and sustain an oscillation signal;
   power splitter means for supplying the output signal appearing at said output of said active device means to the output of the oscillator and coupling a portion of said output signal to said feedback path while isloating the output of the oscillator from said feedback path.

4. The oscillator of claim 3 wherein said active device means is a transistor amplifier.

5. The oscillator of claim 3 wherein the oscillator is a microstrip oscillator.

6. The oscillator of claim 5 wherein said active device means is a transistor.

7. The oscillator of claim 6 wherein said coupler means is a stripline coupler.

8. The oscillator of claim 6 wherein said coupler means is a Wilkinson, coupled line or Lange coupler 9. An oscillator including an active device and a feedback path for providing feedback between the output and the input of the active device for sustaining oscillation, the improvement comprising power splitting means for both splitting power supplied to the input thereof from the device between two outputs and providing isolation between said two outputs to substantially inhibit signals traveling into the first output of said power splitter from being coupled to the second output thereof, said first output of which is coupled to an output of the oscillator and said second output of which is coupled to the feedback path.

* * * * *